US011435395B2

United States Patent
Lee et al.

(10) Patent No.: US 11,435,395 B2
(45) Date of Patent: Sep. 6, 2022

(54) CIRCUIT AND METHOD TO DETECT DEFECTS IN A POWER SWITCHING DEVICE

(71) Applicant: SEMICONDUCTOR COMPONENTS INDUSTRIES, LLC, Phoenix, AZ (US)

(72) Inventors: Junho Lee, Bucheon (KR); Kinam Song, Chandler, AZ (US); Sangmin Park, Bucheon (KR); Seungjae Lee, Bucheon-si (KR); Hyunsoo Bae, Bucheon-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 231 days.

(21) Appl. No.: 16/845,860

(22) Filed: Apr. 10, 2020

(65) Prior Publication Data
US 2021/0318375 A1    Oct. 14, 2021

(51) Int. Cl.
*G01R 31/28* (2006.01)
*G01R 31/327* (2006.01)

(52) U.S. Cl.
CPC ..... *G01R 31/2853* (2013.01); *G01R 31/3275* (2013.01)

(58) Field of Classification Search
CPC .......... G01R 19/16519; G01R 31/2608; G01R 31/2621; G01R 31/2853; G01R 31/3275; G01R 31/54
See application file for complete search history.

(56) References Cited

U.S. PATENT DOCUMENTS

| | | | | |
|---|---|---|---|---|
| 2012/0326756 | A1* | 12/2012 | Amighini | G01R 31/2621 327/109 |
| 2015/0108930 | A1* | 4/2015 | Koller | H02P 6/28 318/400.22 |
| 2017/0350934 | A1* | 12/2017 | Sathik | G01R 31/2617 |
| 2019/0369151 | A1* | 12/2019 | Meiser | G01R 31/2621 |

FOREIGN PATENT DOCUMENTS

JP    2005038918 A1    2/2007

OTHER PUBLICATIONS

Baker et al., "Simultaneous On-State Voltage and Bond-Wire Resistance Monitoring of a Silicon Carbide MOSFETs," Energies 2017, 10, 384.

* cited by examiner

*Primary Examiner* — Lee E Rodak
*Assistant Examiner* — Brent J Andrews
(74) *Attorney, Agent, or Firm* — Brake Hughes Bellermann LLP

(57) ABSTRACT

A circuit and method for detecting a failure of a switching power device is disclosed. The circuit and method utilize a Kelvin connection of a four-terminal configuration of the switching power device to sense a resistance of at least one wire-bond. The resistance corresponds to a defect or defects in the at least one wire-bond and so it can be used to detect a failure before damage occurs. A threshold used for detecting the failure can be adjusted to accommodate variations in the switching power device and/or the application in which it is being used. Additionally, the failure detection is carried out at a period after the switching power device is turned ON to prevent switching transients from affecting the detection.

22 Claims, 8 Drawing Sheets

CIRCUIT AND METHOD TO DETECT DEFECTS IN A POWER SWITCHING DEVICE

FIELD OF THE DISCLOSURE

The present disclosure relates to power semiconductor devices and more specifically to a circuit and method detect a defect in a wire-bond to determine a status of a power switching device.

BACKGROUND

Power electronic devices used for switching, such as power BJTs, power MOSFETs, and power IGBTs may be thermally cycled as they are switched. Over a lifetime, thermal stresses, caused by the switching, can result in one or more bond-wires cracking or lifting-off (i.e., delaminating) from a solder joint. A defect in the bond-wire can progress (i.e., degrade) with use and can ultimately damage or destroy the power switching device (i.e., power device). A damaged or destroyed power device may operate improperly and can be harmful to other circuitry and/or components. Accordingly, accurately detecting bond-wire defects before failure can ensure safe operation and help service and/or repair activities.

SUMMARY

In at least one aspect, the present disclosure generally describes a circuit for detecting a wire-bond failure in a power device. The circuit includes a first comparison circuit. The first comparison circuit is configured to output a detection-window signal based on a comparison of a gate signal of the power device and an ON threshold. The detection-window signal has a transition that is delayed by a filter period to allow for switching transients to subside. The circuit further includes a second comparison circuit that is configured to output a defect detection signal based on a comparison of a wire-bond signal of the power device and an adjustable threshold signal. The wire-bond signal has a level that corresponds to a wire-bond defect in the power device. The circuit further includes a detection circuit that is configured to output a failure-detection signal that is based on a comparison of the detection-window signal and the defect detection signal. The failure-detection signal corresponds to the wire-bond failure in the power device.

In another aspect, the present disclosure generally describes a power switching system that includes a microcontroller unit, a power device, and a driver. The driver includes a circuit for detecting a wire-bond failure in the power device. The circuit for detecting a wire-bond failure in the power device includes a first comparison circuit that is configured to output a detection-window signal based on a comparison of a gate signal of the power device and an ON threshold. The detection-window signal has a transition that is delayed by a filter period to allow for switching transients to subside. The circuit for detecting a wire-bond failure in the power device further includes a second comparison circuit that is configured to output a defect detection signal based on a comparison of a wire-bond signal of the power device and an adjustable threshold signal. The wire-bond signal has a level that corresponds to a wire-bond defect in the power device. The circuit for detecting a wire-bond failure in the power device further includes a detection circuit that is configured to output a failure-detection signal that is based on a comparison of the detection-window signal and the defect detection signal. The failure-detection signal corresponds to the wire-bond failure in the power device.

In another aspect, the present disclosure generally describes a method for detecting a wire-bond failure in a power device. The method includes cycling a power device and sensing a gate voltage of the power device. The method further includes determining that the gate voltage meets or exceeds an ON threshold. After it is determined that a filter period, which started when the gate voltage met or exceeded the ON threshold, has expired, the method includes sensing a wire-bond voltage at a Kelvin connection of the power device, and comparing the wire-bond voltage to an adjustable threshold to obtain a comparison. Then, based on the comparison, the method includes detecting the wire-bond failure in the power device.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
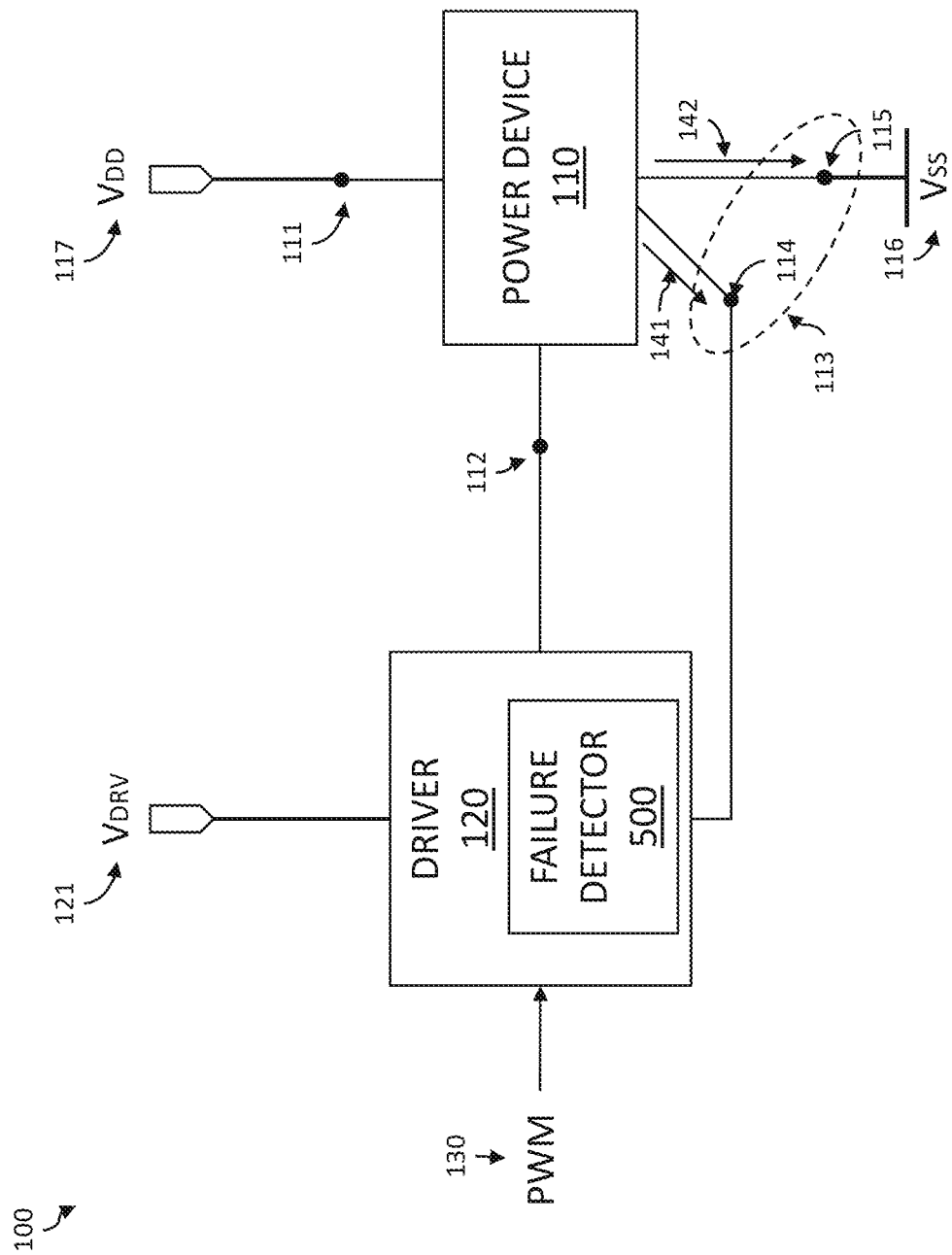
FIG. 1 schematically illustrates a block diagram of a power switching system according to an implementation of the present disclosure.

A failure of a power switching device (i.e., power device) can be harmful to a system and, in some cases, may even be hazardous (e.g., fire risk). As a result, a user may schedule a regular repair and/or replacement of the power device. The schedule may be based on an average rate of failure computed from a statistical test of lifetime. Regular repair/replacement can be costly and/or dangerous because power devices may fail at a time that is before or after their scheduled repair/replacement time. In other words, a power device that is not at risk of failing can be unnecessarily repaired/replaced, and a power device can fail before being repaired/replaced. The disclosed circuits and methods use a feature found in a circuit topology used for power devices in order to detect wire-bond defects that can lead to a failure of the power device. The disclosed circuits and methods may be more accurate than other circuits and methods because the wire-bond defects can be sensed at a time, during each switching cycle, that excludes switching transients. Further, the disclosed circuits and method may be more versatile than other circuits and methods because of an adjustable level determining a wire-bond failure.

Power switching devices, such as a metal-oxide-semiconductor field-effect transistor (MOSFET) and an insulated-gate bipolar transistor (IGBT) may be fabricated in packages or modules that include wire-bonds. Each wire-bond can include one or more bond wires coupled between nodes of an integrated circuit. For example, a wire-bond can include multiple bond wires that are each attached (e.g., soldered) at a first end to pad of a semiconductor circuit and attached (e.g., soldered) at a second (i.e., opposite) end to an external lead (i.e., terminal) of a discrete package or module. The bond wires included in a wire-bond may each have an associated resistance. The resistances of the bond wires can combine electrically (e.g., in a parallel connection) to form a resistance of the wire-bond (i.e., a wire-bond resistance). The bond wires included in a wire-bond may also have an associated inductance that can reduce a maximum switching rate and increase an energy loss during switching. These reductions may be significant in power switching devices, which may require longer and more substantial bond wires to handle high voltages. Accordingly, power switching devices may be fabricated using a circuit topology to avoid these effects.

To avoid negative switching effects, one terminal of a three-terminal power switching device (e.g., a gate terminal, a base terminal) may be replaced by two terminals (i.e., a Kelvin connection), thereby making a four-terminal power switching device. For example, an emitter terminal of an IGBT may be replaced by a Kelvin-emitter terminal (i.e., Kelvin-emitter) and a power-emitter terminal (i.e., power-emitter). The Kelvin connection separates a first current path of a signal to control the IGBT from a second current path of a load current (i.e., a collector-emitter current, $I_{CE}$). The separation of current paths can reduce or eliminate an inductance along the first current path to allow for faster switching control.

FIG. 1 schematically illustrates a block diagram of power switching system according to an implementation of the present disclosure. The power switching system 100 includes a power device 110. The power device 110 includes a first terminal 111 coupled to a supply voltage for power signals 117 (i.e., $V_{DD}$), a second terminal 112 coupled to a gate driver circuit (i.e., driver 120), and a Kelvin connection 113. The Kelvin connection 113 includes a Kelvin terminal 114, which is coupled to the driver 120, and a power terminal 115, which is coupled to a ground voltage for power signals 116 (i.e., $V_{SS}$). The driver 120 is coupled to a supply voltage for switching signals 121 (i.e., $V_{DRV}$) and receives a pulse width modulated (PWM) switching signal 130.

Based on the switching signal 130, the driver 120 is configured to control the power device 110 by a signal (e.g., a voltage) applied to the second terminal 112. In particular, a current may be caused to flow from the supply voltage for power signals 117 ($V_{DD}$) to the Kelvin connection 113. At the Kelvin connection, the current is split into a first portion 141 that flows to a ground for switching signals (i.e., signal ground) and a second portion 142 that flows to the ground voltage for power signals 116 (i.e., power ground).

Figure 2:
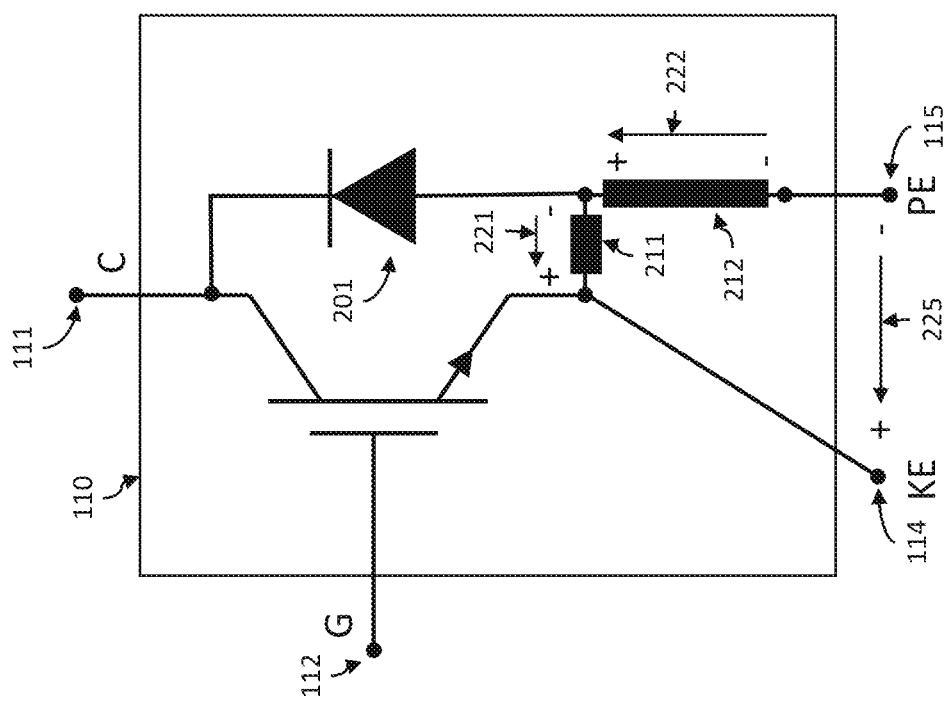
FIG. 2 schematically illustrates a power device according to an implementation of the present disclosure.

The power device shown in FIG. 1 may be any switching power device that includes a Kelvin connection 113. For example, the power device can be a diode, a BJT, a MOSFET, or an IGBT. FIG. 2 schematically illustrates an IGBT implementation of the power device 110. In this implementation, the first terminal 111 is a collector (C) of the IGBT, the second terminal 112 is a gate (G) of the IGBT, the Kelvin terminal 114 is a Kelvin emitter (KE) of the IGBT, and the power terminal 115 is a power emitter (PE) of the IGBT. The IGBT can, in some implementations, include a diode 201 (i.e., a freewheeling diode) for operation with inductive loads.

As part of fabrication, the Kelvin emitter and the power emitter can be coupled to a common node (i.e., coupled together) via wire-bonds. For example, a first wire-bond 211 may couple the Kelvin emitter (KE) to an anode of the diode 201 and a second wire-bond 212 may couple the power emitter (PE) to the anode of the diode 201. The first wire-bond 211 and the second wire-bond 212 may include at least one bond wires. The at least one bond wires may have the same or different diameter, length, and/or material.

When the IGBT is configured in a conducting state (i.e., ON), current can flow from the collector (C) to the Kelvin emitter (KE) and the power emitter (PE). The first wire-bond 211 and the second wire-bond 212 can have a non-zero resistance so that when the current flows, a first voltage 221 is induced across the first wire-bond 211 and a second voltage 222 is induced across the second wire-bond 212. Accordingly, a Kelvin-connection signal (i.e., wire-bond signal) that is the sum of the first voltage and the second voltage can be sensed as a Kelvin voltage 225 between the Kelvin emitter (KE) and the power emitter (PE). When the power emitter is coupled to a ground (e.g., a power ground) then the Kelvin-connection signal can be a Kelvin emitter voltage.

A failure of the power device 110 may correspond to a failure of first wire-bond 211 and/or a failure of the second wire-bond 212. A failure of the first and/or second wire-bonds may be determined by sensing defects in the one or more bond wires of the wire-bonds. A bond-wire may form defects (i.e., may be damaged) as a result of temperature cycling (i.e., thermal cycling). Each switching cycle (i.e., ON/OFF) of the IGBT may cause the device to experience a change in temperature ($\Delta TJ$) due to the current carried by the semiconductor during the cycle. The change in temperature can form a defect in a bond wire through a mechanical stress resulting from an expansion and contraction with temperature. Further, repeated thermal cycling (i.e., repeated ON/OFF cycles) may deepen, expand, or otherwise increase the defect.

Figure 3:
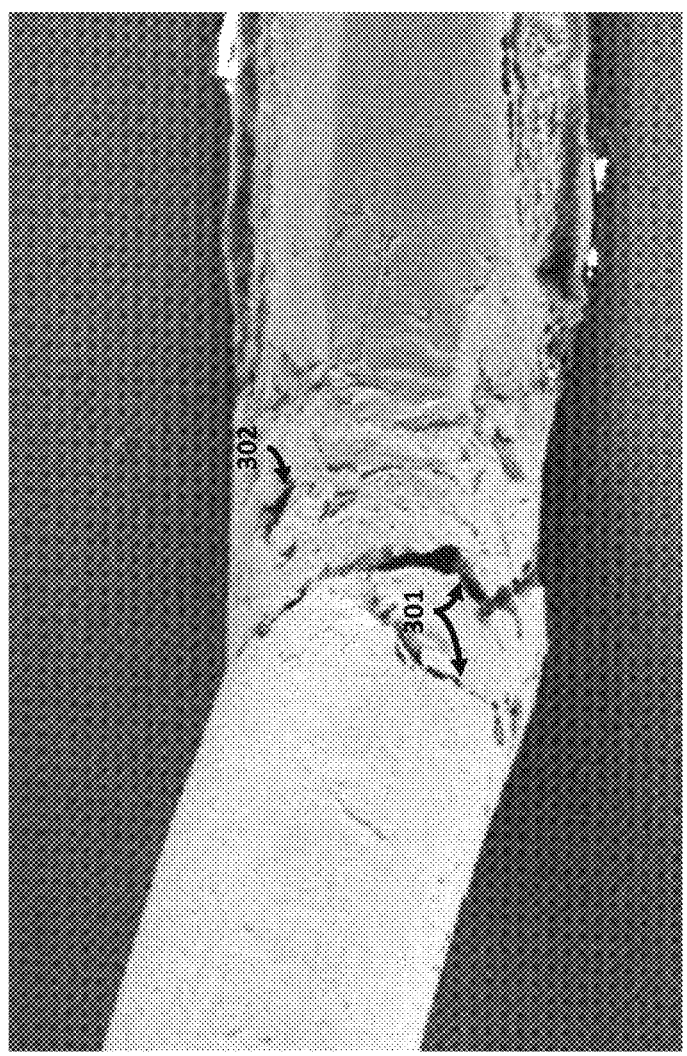
FIG. 3 is a perspective image of a bond wire for a power device according to an implementation of the present disclosure.

FIG. 3 is an image of a bond wire that includes defects as a result of thermal cycling. As shown, the defects can include cracks 301 (e.g., wire heel crack) in the bond wire or pits 302 in the bond wire. The cracks and/or pits may, or may not, extend through the bond wire completely. Additionally, the defects can include the bond wire lifting off of connection point. For example, a bond wire soldered to a semiconductor die may lift off (i.e., delaminate) to become partially or fully disconnected from the semiconductor die.

Defects in the at least one bond wire of the first wire-bond 211 can increase a first resistance of the first wire-bond 211, and defects in the at least one bond wire of the second wire-bond 212 can increase a second resistance of the second wire-bond 212. Accordingly, a wire-bond signal (e.g., wire-bond voltage) can provide a measure of and/or change to the defects.

Figure 4:
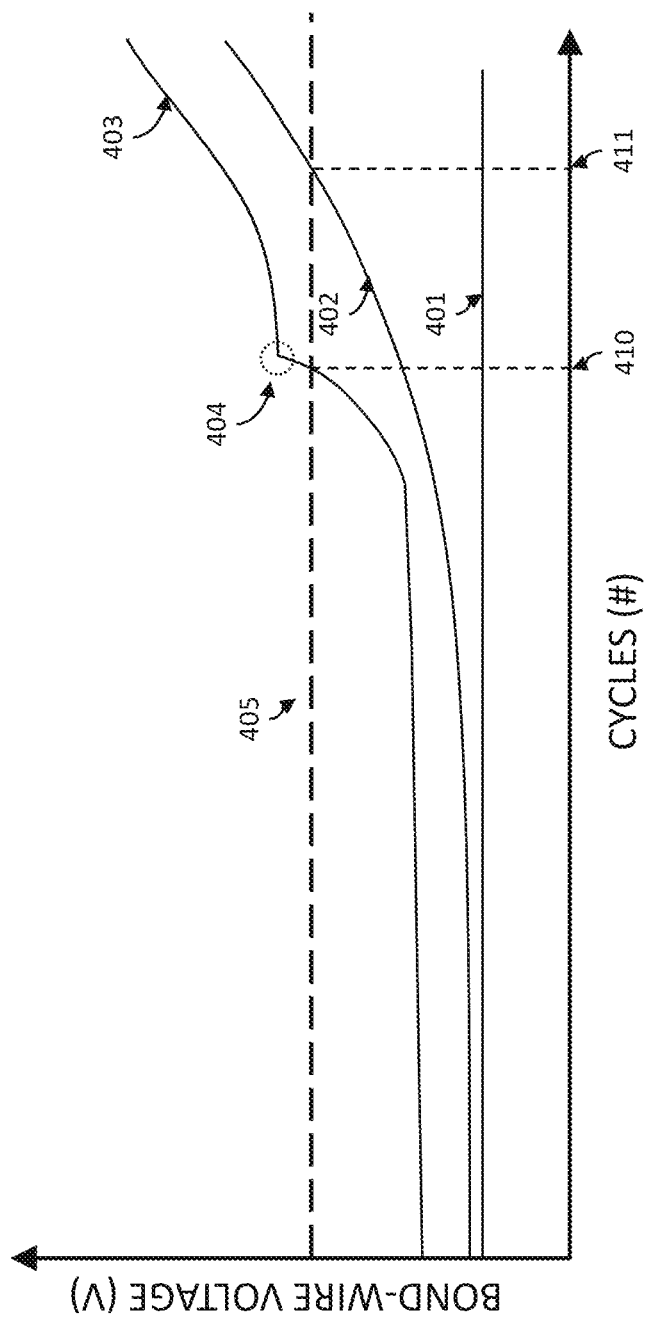
FIG. 4 includes graphs corresponding to resistances of wire-bonds in a plurality of power devices versus a number of power cycles of the plurality of devices.

FIG. 4 is a graph of wire-bond voltage versus a number of switching (ON/OFF) cycles for three examples of a power device. In other words, the graph illustrates wire-bond voltage for three different power devices of the same type (e.g., the same model) as they are ON/OFF cycled. As mentioned, a wire-bond voltage can be proportional to a resistance of bond wires of a power device so that an increase in a wire-bond voltage indicates an increase in a resistance of the bond-wire (e.g., due to defects). In the graph, a first power device 401 has a wire-bond voltage than does not appreciatively change with cycles. A second power device 402 has a wire-bond voltage that increases according to a monotonically increasing rate. A third power device 403 has a wire-bond voltage that increases at a variety of rates. A point 404 between a high rate of change and a low rate of change may indicate damage, such as one bond wire of a group of bond wires breaking. Wire-bond defects may affect the operation of the power device as they increase and may ultimately lead to a failure of the power device.

To prevent failure of a power device, a level of degradation (i.e., a critical wire-bond defect level) of a wire-bond defect can be set to trigger some response. For example, a wire-bond signal that matches a failure criterion (e.g., meets or exceeds the critical defect level 405) may generate a fault status signal that triggers a shutdown of a gate driver controlling the power device. In another example, a wire-bond voltage that matches a failure criterion (e.g., meets (or exceeds) the critical defect level 405) may generate a fault status signal that triggers a notification that the power device needs service.

FIG. 4 illustrates a critical defect level 405 and how it affects the repair/replacement of the three devices. The monitored defects in the first device 401 never reach the critical defect level 405 during the period shown in the graph. Accordingly, this device is never removed from operation (i.e., for repair/replacement). The monitored defects in the second device 402 reach the critical defect level 405 at a time 411 that is longer than a time 410 for the third device 403. Repair or replacement schedules of each of the devices may be different.

Figure 5:
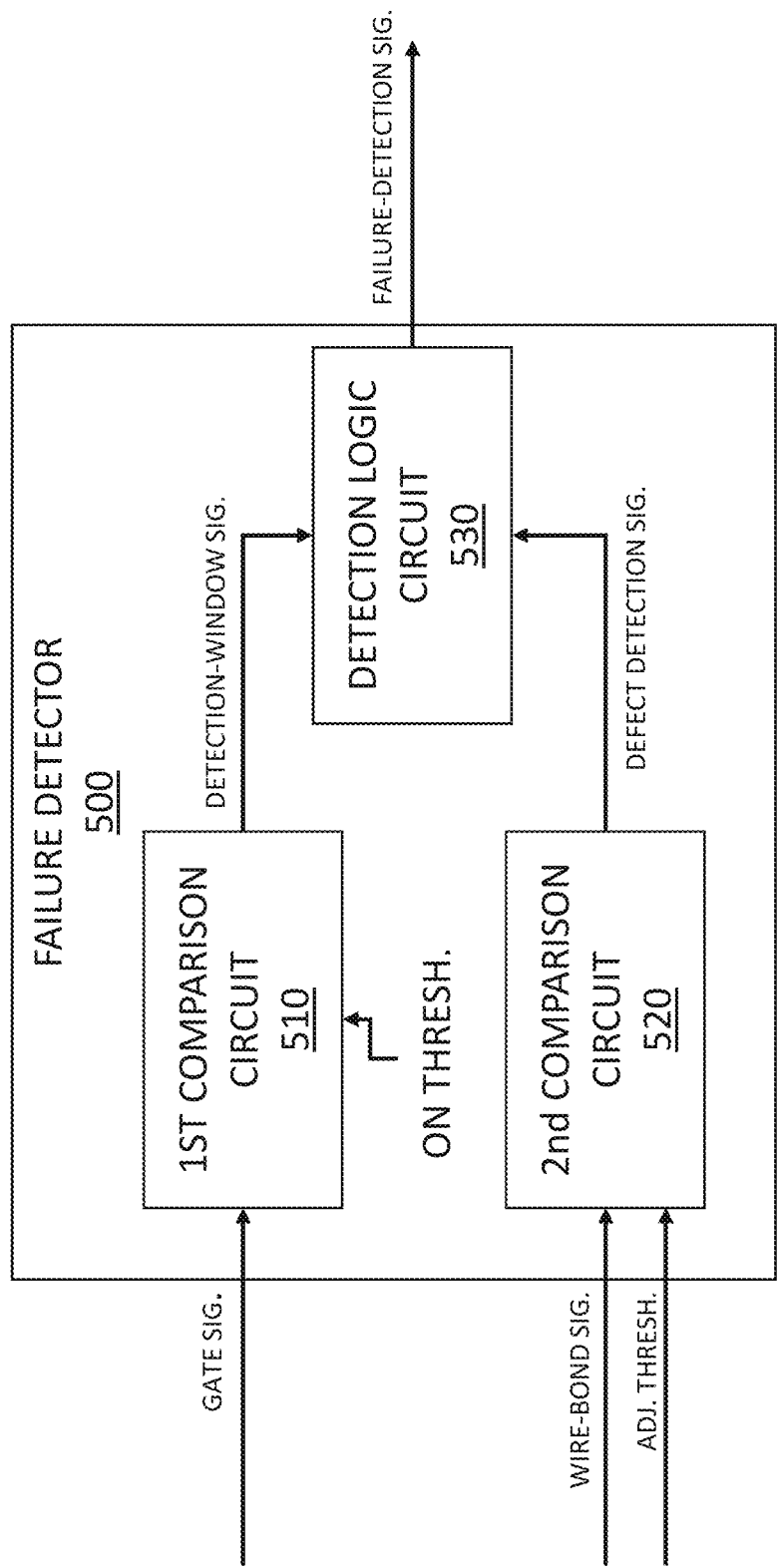
FIG. 5 is a block diagram of a circuit for detecting defects in a power device according to an implementation of the present disclosure.

FIG. 5 is a circuit for detecting a wire-bond failure in a power device. In a possible implementation, the failure detector circuit (i.e., failure detector 500) is integrated with a driver 120 of a power switching system, such as shown in FIG. 1. The failure detector circuit (i.e., failure detector 500) includes a first comparison circuit 510. The first comparison circuit 510 is configured to output a detection-window signal. The detection-window signal may be a binary signal having a first level corresponding to a transient period after the power device is turned ON in which transient signals from switching the power device are present and a second level corresponding to a transient-free period after the transient period in which the transient signals have subsided.

The first comparison circuit 510 can receive a gate signal (or base signal) from the power switching device (e.g., from a gate terminal of the power device). At the start of a switching cycle the power device is turned ON and the gate signal increases. The gate signal can be compared to an ON threshold to determine when the power device has been fully turned ON. In other words, the ON threshold can correspond to a gate voltage of the power device in the ON condition. Accordingly, the first comparison circuit 510 may output the first level before the gate signal has reached the ON threshold and then output the second level at some time after the gate signal has reached the ON threshold. For example, after the gate signal reaches the ON threshold, the first comparison circuit may wait for a period before transitioning the detection-window signal between the first level (e.g., LOW) and the second level (e.g., HIGH).

As shown in FIG. 5, the failure detector 500 further includes a second comparison circuit 520. The second comparison circuit is configured to output a defect detection signal based on a comparison between a wire-bond signal (e.g., wire-bond voltage) and a threshold signal (e.g., the critical defect level 405). The threshold signal can be adjustable (i.e. adjustable threshold signal) and transmitted to an input of the failure detector circuit. The defect detection signal may be a binary signal having (i) a first level (e.g., LOW) when the wire-bond signal does not match a criterion based on the adjustable threshold and (ii) having a second level (e.g. HIGH) when the wire-bond signal matches the criterion based on the adjustable threshold. For example, the second comparison circuit 520 may output a LOW defect detection signal when a wire-bond voltage is below the critical defect level and may output a HIGH defect detection signal with a wire-bond voltage is at, or above, the critical defect level.

As shown in FIG. 5, the failure detector 500 further includes a detection logic circuit 530 (i.e., detection circuit). The detection logic circuit is configured to output a failure-detection signal (i.e., fault signal). The failure-detection signal may be a binary signal having a first level and a second level based on a logical combination of the detection-window signal and the defect detection signal. For example, the detection logic circuit may include an AND gate so that the failure detection signal (i) is LOW when either the defect detection signal or the detection window signal are LOW and (ii) is HIGH when both the defect detection signal and the detection-window signal are HIGH. In other words, the failure-detection signal may be HIGH to indicate a failure of the power device when a defect is detected during a portion of the switching cycle in which the transient signals have been reduced (i.e., have subsided naturally, rung down, etc.).

Figure 6:
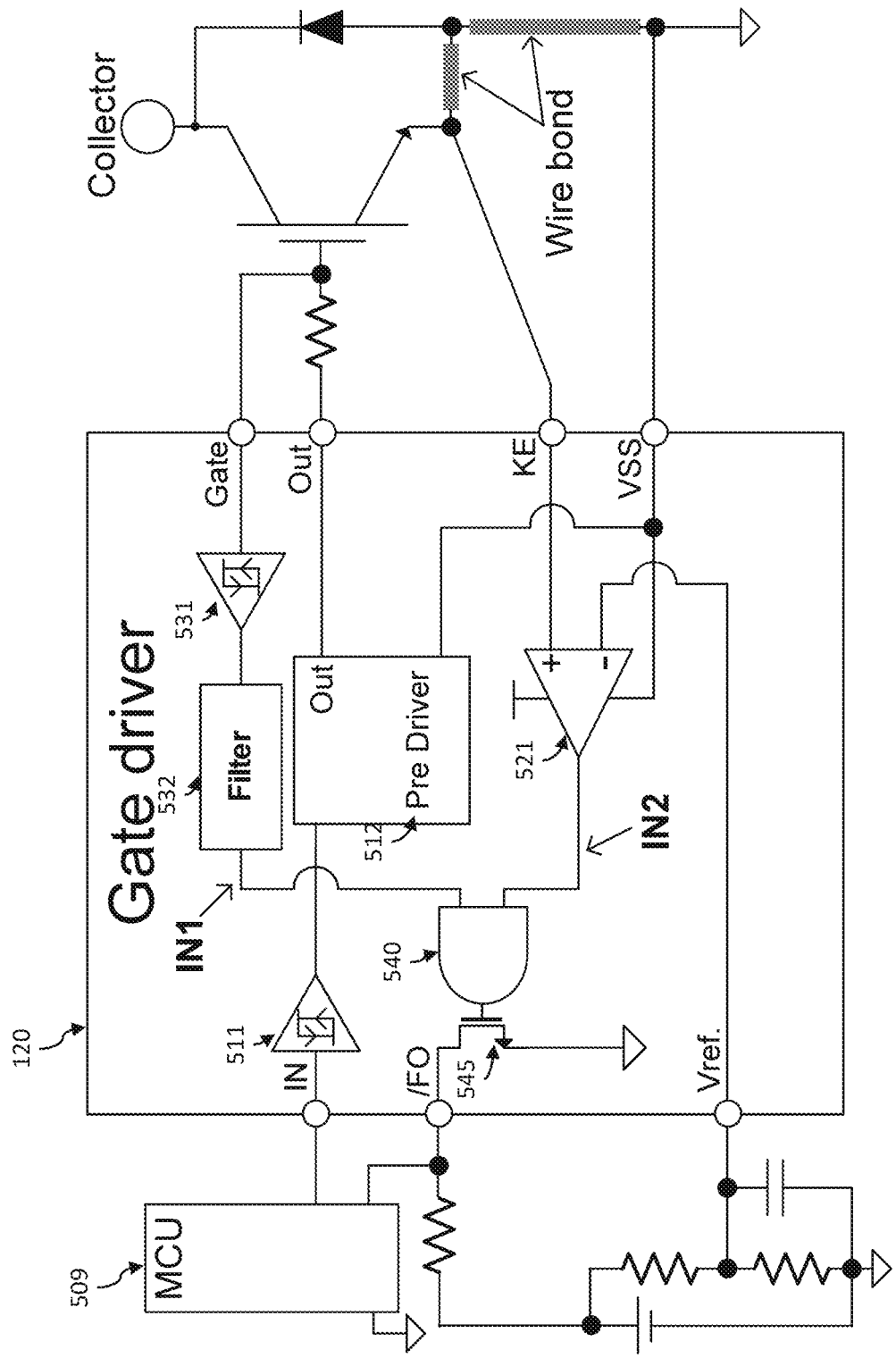
FIG. 6 schematically illustrates a circuit for detecting wire-bond defects.

FIG. 6 schematically illustrates one particular implementation of the power switching system. As shown, an IGBT is controlled by a driver 120, which is in turn controlled by a microcontroller unit (MCU). The microcontroller unit (i.e., MCU 509) provides a pulse width modulation (PWM) signal to an input (IN). The PWM signal is processed by a schmitt trigger 511 and a pre-driver circuit 512 to produce a signal (e.g., voltage) at an output (OUT). The output is coupled to a controlling terminal (e.g., gate) of the power device so that the power device is configured ON/OFF according to the PWM signal. The gate driver also includes failure detector circuit.

The failure detector circuit is configured to receive an adjustable threshold at a reference input ($V_{REF}$). Additionally, the failure detector circuit receives a wire-bond voltage at a Kelvin emitter input (KE). The wire-bond voltage is relative to a voltage received at a power ground input (VSS). The wire-bond voltage can be compared to the adjustable threshold (i.e., critical defect level) using a comparator 521. The comparator 521 is configured to output a defect-detection signal (IN2) that has a first level (e.g., a digital LOW) when the wire-bond voltage is below the critical defect level and a second level (e.g., a digital HIGH) when the wire-bond voltage is at (or above) the critical defect level.

The circuit for detecting wire-bond defects is configured to receive a gate voltage at a gate input (GATE). As the power device is turned ON by the PWM signal, the gate voltage ($V_{GE}$) increases. The gate voltage is processed by a Schmitt trigger 531 and a filter 532 to produce a detection-window signal (IN1). The Schmitt trigger 531 includes a threshold corresponding to an ON level of the power device. Accordingly, the Schmitt trigger can be configured to output a first level (e.g., a digital LOW) when the gate voltage is below the ON level of the power device and to output a second level (e.g., a digital HIGH) when the gate voltage is at, or above, an ON level of the power device. The filter is configured to receive the Schmitt trigger signal and to output the detection-window signal (IN1). The detection-window signal (IN1) can be a delayed version of the Schmitt trigger signal. In other words, the filter can delay the output of the Schmitt trigger signal so that a transition (e.g., from LOW to HIGH) of the Schmitt trigger signal occurs after a filter period. The filter period may be configured based on the power device and the wire bonds so that all switching transients associated with the power device turning ON have settled before the defect detection signal (IN2) is considered.

The circuit for detecting wire-bond defects includes a logic gate (e.g., AND gate) that is configured to receive the detection-window signal (IN1) and the defect detection signal (IN2). At the start of a switching cycle, the detection-window signal (IN1) is initially a logical low (LOW) and transitions to a logical high (HIGH) at a time after switching transients the wire-bond signal have settled. Accordingly, IN1 is configured to set a detection window during which the wire-bond signal is considered. After the detection-window signal (IN1) transition to high, the digital level of the defect detection (IN2) determines if a wire-bond voltage is in excess of the critical defect level and to output a failure-detection signal (i.e., a fault signal) at a fault output (/FO). The fault signal indicates a critical wire-bond defect when it is a LOW digital level. The logical states of the circuit for detecting wire-bond defects (FIG. 6) are shown below in TABLE 1.

TABLE 1

Truth table for example circuit for detecting wire-bond defects

| IN1 | IN2 | /FO |
|---|---|---|
| LOW | d/c | HIGH |
| HIGH | LOW | HIGH |
| HIGH | HIGH | LOW |

As shown in TABLE 1, when the detection-window signal (IN1) is LOW (i.e., before the switching transients have settled), the level of the wire-bond signal (HIGH/LOW) does not affect the fault signal. Accordingly, during this period the wire-bond signal (e.g., wire-bond voltage) is permitted to overshoot according to switching transients without causing the fault signal to trigger an action (i.e. without causing a false alarm). When the detection-window signal (IN1) is HIGH (i.e., after the switching transients have settled), the level of the defect detection signal (HIGH/LOW) does affect the fault signal. In particular, when the defect detection signal (IN2) is LOW the output of the AND gate 540 is LOW and when the defect detection signal (IN2) is HIGH, the output of the AND gate 540 is HIGH.

The output of the AND gate configures a transistor 545 coupled between ground and the fault output (/FO) so that when the output of the AND gate 540 is HIGH the fault signal is pulled LOW by the transistor 545. The fault signal can be coupled to the MCU 509 so that an action may be taken upon receiving a LOW fault signal (i.e., active-low fault signal). Because this fault signal is computed each switching cycle, the action taken upon detecting a defect may be as fast as a cycle.

The circuit for detecting wire-bond defects shown in FIG. 6 (i.e., circuit) is one possible implementation. Variations to the signal (e.g., TABLE 1) and the components (e.g., logic elements) may be changed without changing the effect of detecting wire-bond defects. Accordingly, any circuit configured to receive a signal corresponding primarily to a wire bond defect (e.g., from a Kelvin connection), that is compared to an adjustable reference level, and that is measured for a defect at a time during a switching cycle after transients have settled is within the scope of the disclosure.

Figure 7:
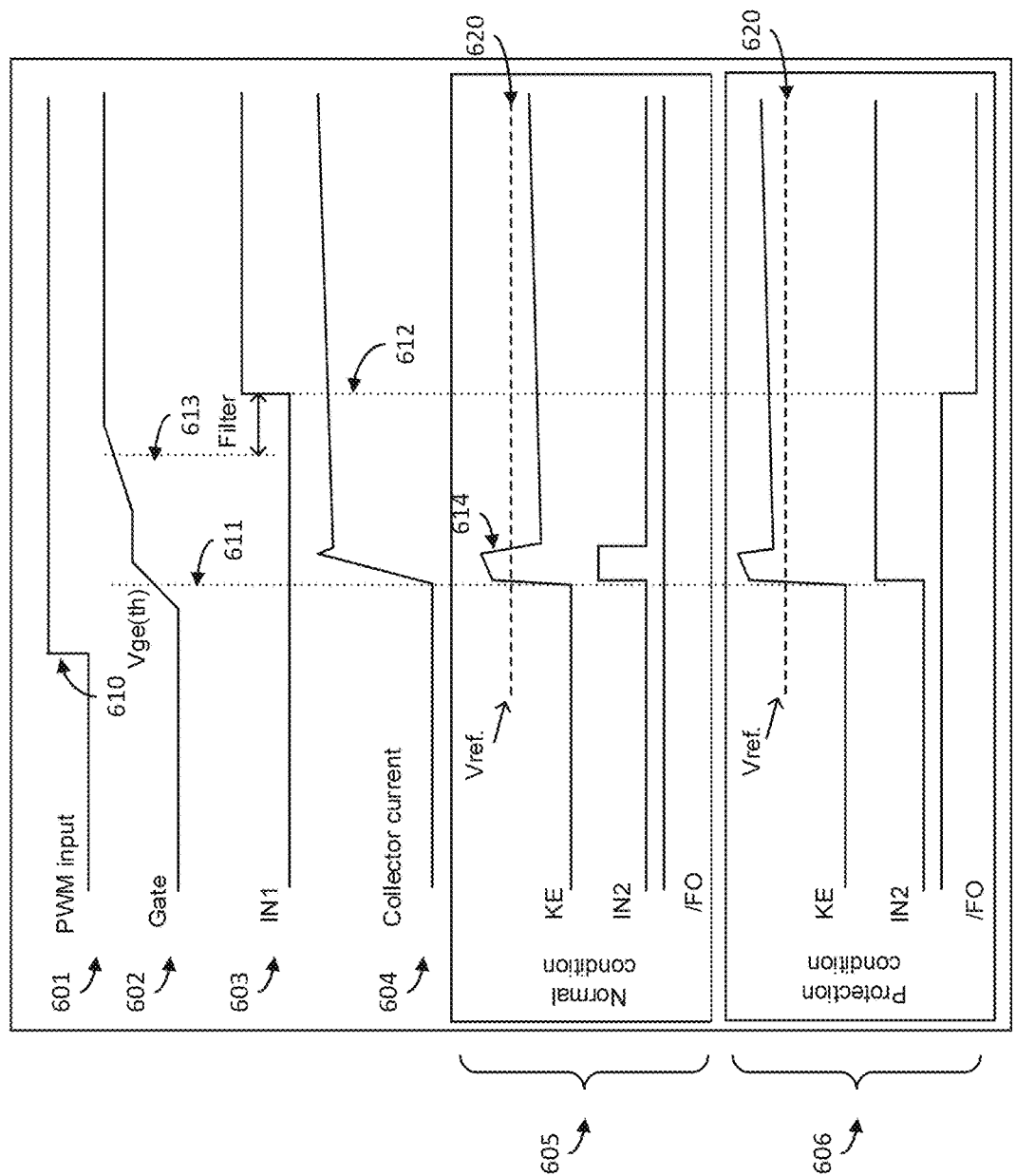
FIG. 7 includes graphs of signals in the circuit for detecting wire-bond defects according to FIG. 6.

FIG. 7 includes graphs of signals in the circuit for detecting wire-bond defects according to FIG. 6. The graphs are all aligned to the same time scale (i.e., X-axis). The graphs include input signals during a switching cycle and further include signals according to a normal condition 605 (i.e., no fault) and a protection condition 606 (i.e., fault). The graphs include a PWM input 601 at the input (IN) of the circuit, a gate voltage 602 at a gate input (GATE) of the circuit, and a collector current 604 of the power device. After a start 610 of an ON portion of a switching cycle, the power device (e.g., IGBT) begins to conduct a collector current 604 at a first time 611, and the gate voltage rises according to the characteristics of the power device (e.g., gate capacitance, etc.). The detection-window signal 603 (IN1) transitions at a second time 612 that is after a third time 613 at which the gate voltage reaches an ON voltage (e.g., 13-14V).

In the normal condition 605, the wire-bond voltage at the Kelvin emitter (KE) rises and overshoots 614 a critical defect level 620. The defect detection (IN2) is HIGH for the portion of the wire-bond voltage signal that is above the critical defect level 620 but then drops back down below the critical defect level 620 after the switching transients settle. Accordingly, the detection-window signal (IN1) and the defect detection signal (IN2) are never simultaneously HIGH so the detection logic circuitry never defects even though the defect detection (IN2) was above the critical defect level 620 for a period.

In the protection condition 606, the wire-bond voltage at the Kelvin emitter (KE) rises and overshoots 614 the critical defect level 620 as before but does not relax below the critical defect level 620 after the transients settle. Accordingly, the defect detection signal (IN2) is HIGH for the entire switching cycle. The detection-window signal (IN1) and the defect detection signal (IN2) are simultaneously high at the second time 612 and the fault signal is pulled low.

Figure 8:
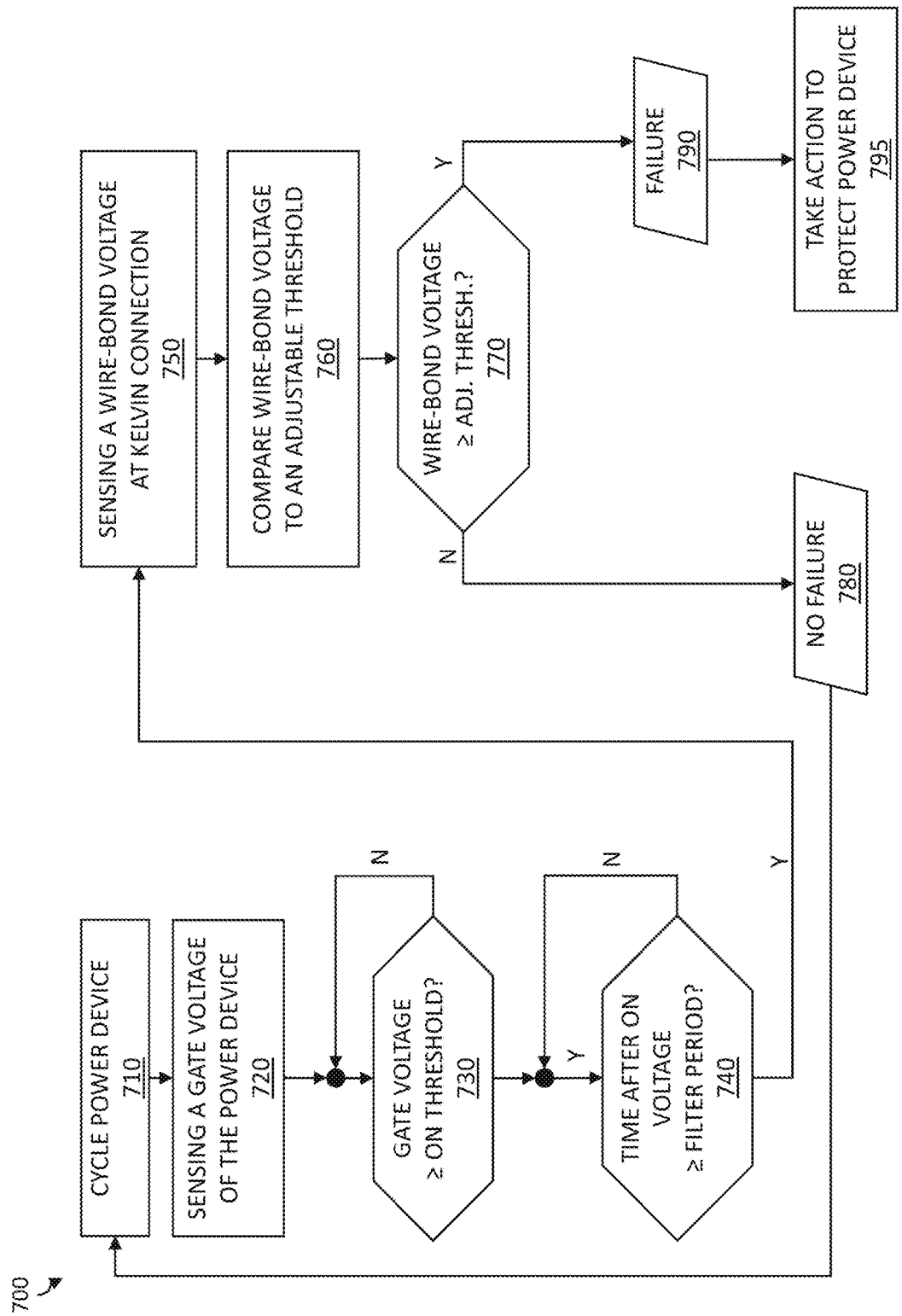
FIG. 8 is a flowchart of a method for detecting wire-bond defects according to an implementation of the present disclosure.

FIG. 8 is a flowchart of a method for detecting wire-bond defects according to an implementation of the present disclosure. The method 700 includes cycling 710 a power device by turning in ON. After the power device is turned on, the gate voltage increases. The increasing gate voltage is sensed 720 and compared 730 to voltage at which the power device is considered fully ON (i.e., ON voltage). When the gate voltage exceeds the ON voltage, a detection-window signal (IN1) is transitioned after a filter period 740 to allow for transients corresponding to the switching to subside. After the period expires, the method includes sensing 750 a wire-bond voltage at a Kelvin connection (e.g., Kelvin emitter) and comparing 760 the wire-bond voltage to an adjustable threshold. Based on the comparison a fault may be detected or no fault may be detected 770. For example, when the wire-bond voltage is below the adjustable threshold, no fault 780 is detected and the processes repeats for the next cycle. When the wire-bond voltage is above the adjustable threshold, however, a fault 790 is detected and the method include taking an action to protect 795 the power device.

When a wire-bond voltage increases due to one or more bond wire defects, to a critical defect level, a fault signal may be generated. The fault signal may be a digital signal that is at a first digital level (e.g., HIGH) when the wire-bond voltage is below the critical defect level and at a second digital level (e.g., LOW) when the wire-bond voltage is at, or above, the critical defect level. The fault signal may be received by a processor (e.g., a microprocessor, a microcontroller, a state machine, etc.) which may be configured (e.g., by software instructions) to provide a response. For example, a response may be to shut down a signal (e.g., a PWM signal) provided to a gate driver of the power device. In another example, a response may be to shut down (e.g., disable) a gate driver of the power device. In another example, a response may be to transmit an alert. In another example, a response may prevent subsequent cycles of the power device.

The disclosed measurement topology can provide a critical defect level comparison that is less affected by other sources of resistance than other measurement topologies. The topology for a power device with a Kelvin connection provides a port (i.e., terminals) to measure a resistance of bond-wires without measuring the resistance of the power device. The resistance measurement using this port can be more correlated with a bond-wire defect than other resistance measurements. For example, measuring the resistance between a Kelvin terminal and a power terminal can prevent other resistances of the power device from affecting a measurement of a resistance associated with bond-wire degradation. These added resistances could affect a detection of a critical defect level (e.g., could generate a false alarm).

The disclosed circuits and methods perform a measurement of the voltage (e.g., resistance) of the bond wires at a time that is after the transient and are therefore provide a more accurate measurement of the bond wire resistance than other circuits and methods that do not account for the transient period. A critical defect level comparison may also be affected by a switching transient. For example, when a power device is switched to an ON state, a voltage at the Kelvin connection can overshoot as a result of a bond wires inductance ($V=L \cdot di/dt$). The overshoot may persist for a transient period before the voltage at the Kelvin connection stabilizes.

The disclosed circuits and method provide a settable critical defect level, which facilitates use with a variety of power devices in a variety of applications. The critical defect level may not be the same for every power device or for every application of a power source. Accurately setting the critical defect level 405 may be important for accurately predicting a failure. The setting may depend on a maximum impedance of the wire-bonds, which can be determined through a statistical test of similar power devices. The setting may also depend on a load condition (i.e., operating current) of the power device, which can be determined based on the application. Further, empirical measurements and heuristic data may prompt a change (i.e., update) to a previously set critical defect level.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A circuit for detecting a wire-bond failure in a power device, comprising:
   a first comparison circuit configured to output a detection-window signal based on a comparison of a gate signal from a gate terminal of the power device and an ON threshold, the first comparison circuit including a filter configured to delay a transition of the detection-window signal by a filter period after the comparison indicates that the power device is turned ON;
   a second comparison circuit configured to output a defect detection signal based on a comparison of a wire-bond signal from an emitter terminal of the power device and an adjustable threshold signal, the wire-bond signal having a level corresponding to a wire-bond defect in the power device; and
   a detection circuit configured to receive the detection-window signal from the first comparison circuit and the defect detection signal from the second comparison circuit, the detection circuit including logic configured to output a failure-detection signal based on a level of the defect detection signal after the transition of the detection-window signal, a level of the failure-detection signal corresponding to the wire-bond failure in the power device.

2. The circuit for detecting a wire-bond failure in a power device according to claim 1, wherein the filter period corresponds to a time necessary for switching transients of the power device to subside.

3. The circuit for detecting a wire-bond failure in a power device according to claim 1, wherein the power device is an IGBT and the emitter terminal is a Kelvin emitter terminal.

4. The circuit for detecting a wire-bond failure in a power device according to claim 1, wherein the first comparison circuit includes a Schmitt trigger to compare the gate signal to the ON threshold, the ON threshold corresponding to a gate voltage of the power device in an ON condition.

5. The circuit for detecting a wire-bond failure in a power device according to claim 4, wherein the filter of the first comparison circuit is coupled to an output of the Schmitt trigger, the filter configured to delay the transition of the Schmitt trigger by the filter period.

6. The circuit for detecting a wire-bond failure in a power device according to claim 1, wherein the second comparison circuit includes a comparator configured to compare the wire-bond signal and the adjustable threshold signal.

7. The circuit for detecting a wire-bond failure in a power device according to claim 1, wherein the emitter terminal is a Kelvin emitter terminal of an insulated gate bipolar transistor and wherein the wire-bond signal is a wire-bond voltage measured at the Kelvin emitter terminal of the insulated gate bipolar transistor.

8. The circuit for detecting a wire-bond failure in a power device according to claim 1, wherein the wire-bond defect includes one or more cracks in one or more bond wires of a wire-bond.

9. The circuit for detecting a wire-bond failure in a power device according to claim 1, wherein the logic of the detection circuit includes an AND gate.

10. The circuit for detecting a wire-bond failure in a power device according to claim 9, wherein the detection circuit includes a transistor coupled to an output of the AND gate.

11. A power switching system comprising:
   a microcontroller unit;
   a power device; and
   a driver that includes a circuit for detecting a wire-bond failure in the power device, the circuit including:
      a first comparison circuit configured to output a detection-window signal based on a comparison of a gate signal from a gate of the power device and an ON threshold, the first comparison circuit including a filter configured to delay a transition of the detection-window signal by a filter period after the comparison indicates that the power device is turned ON;
      a second comparison circuit configured to output a defect detection signal based on a comparison of a wire-bond signal from an emitter of the power device and an adjustable threshold signal, the wire-bond signal having a level corresponding to a wire-bond defect in the power device; and
      a detection circuit configured to receive the detection-window signal from the first comparison circuit and the defect detection signal from the second comparison circuit, the detection circuit including logic configured to output a failure-detection signal based on a level of the defect detection signal after the transition of the detection-window signal, a level of the failure-detection signal corresponding to the wire-bond failure in the power device.

12. The power switching system according to claim 11, wherein the filter period corresponds to a time necessary for switching transients of the power device to subside.

13. The power switching system according to claim 11, wherein the power device is an IGBT and emitter is a Kelvin emitter, the IGBT further including a power emitter that is coupled to a ground.

14. The power switching system according to claim 13, wherein the Kelvin emitter is coupled to a common node by a first wire-bond and the power emitter is coupled to the common node by a second wire-bond.

15. The power switching system according to claim 14, wherein the wire-bond signal is a wire-bond voltage between the Kelvin emitter and the power emitter, the wire-bond voltage corresponding to a resistance of the first wire-bond and a resistance of the second wire-bond.

16. The power switching system according to claim 11, wherein the microcontroller unit is configured to receive the failure-detection signal and to take an action to protect the power device.

17. The power switching system according to claim 16, wherein the action is shutting down the driver.

18. The power switching system according to claim 16, wherein the action is generating a notification that the power device needs service.

19. A method for detecting a wire-bond failure in an insulated gate bipolar transistor (IGBT), the method including:
   cycling the IGBT to an ON condition;
   sensing a gate voltage at a gate of the IGBT;
   determining that the gate voltage meets or exceeds an ON threshold;
   determining that a filter period has expired, the filter period starting when the gate voltage exceeds the ON threshold;
   sensing, after the filter period has expired, a wire-bond voltage at a Kelvin emitter of the IGBT;
   comparing the wire-bond voltage to an adjustable threshold to obtain a comparison; and
   detecting the wire-bond failure in the IGBT based on the comparison.

20. The method for detecting a wire-bond failure in an IGBT according to claim 19, further comprising:
   performing an action to protect the IGBT after detecting the wire-bond failure.

21. The method for detecting a wire-bond failure in an IGBT according to claim 20, wherein performing the action includes:
   preventing subsequent cycling of the IGBT.

22. The method for detecting a wire-bond failure in an IGBT according to claim 20, wherein performing the action includes:
   servicing the IGBT.

* * * * *